(12) United States Patent
Hsieh et al.

(10) Patent No.: US 10,916,186 B2
(45) Date of Patent: Feb. 9, 2021

(54) DISPLAY APPARATUS, ELECTROLUMINESCENT DISPLAY PANEL AND METHOD OF ACQUIRING AND DISPLAYING IMAGE BY DISPLAY APPARATUS

(71) Applicant: BOE Technology Group Co., Ltd., Beijing (CN)

(72) Inventors: Mingche Hsieh, Beijing (CN); Shanchen Kao, Beijing (CN); Haijun Qiu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/326,774

(22) PCT Filed: Jul. 18, 2018

(86) PCT No.: PCT/CN2018/096126
§ 371 (c)(1),
(2) Date: Feb. 20, 2019

(87) PCT Pub. No.: WO2019/015605
PCT Pub. Date: Jan. 24, 2019

(65) Prior Publication Data
US 2019/0206953 A1    Jul. 4, 2019

(30) Foreign Application Priority Data
Jul. 21, 2017    (CN) .......................... 2017 1 0602326

(51) Int. Cl.
*G09G 3/3208* (2016.01)
*H01L 27/32* (2006.01)
(Continued)

(52) U.S. Cl.
CPC ......... *G09G 3/3208* (2013.01); *G09G 3/2074* (2013.01); *G09G 3/3225* (2013.01);
(Continued)

(58) Field of Classification Search
CPC ............. H01L 27/3234; H01L 27/3246; H01L 51/5234; H01L 51/5231; H01L 51/0096;
(Continued)

(56) References Cited

U.S. PATENT DOCUMENTS

| | | | |
|---|---|---|---|
| 8,390,671 B2 * | 3/2013 | Kanade | H04N 5/2254 348/14.01 |
| 8,698,712 B2 * | 4/2014 | Hsieh | H01L 27/3267 345/80 |

(Continued)

FOREIGN PATENT DOCUMENTS

| | | |
|---|---|---|
| CN | 101963711 A | 2/2011 |
| CN | 106654047 A | 5/2017 |
| CN | 106684102 A | 5/2017 |

OTHER PUBLICATIONS

International Search Report and Written Opinion (including English translation of Search Report and Box V of Written Opinion) for International Application No. PCT/CN2018/096126, dated Oct. 23, 2018, 12 pages.

*Primary Examiner* — Michael J Jansen, II
(74) *Attorney, Agent, or Firm* — Westman, Champlin & Koehler, P.A.

(57) ABSTRACT

Embodiments of the present disclosure disclose a display apparatus, an electroluminescent display panel and a method of acquiring and displaying an image by the display apparatus. The display apparatus includes an electroluminescent display panel; and a camera. The electroluminescent display panel includes: a substrate; and a plurality of pixel units disposed in a display area on the substrate and each including at least two sub-pixels. The display area has an image
(Continued)

acquiring region including the sub-pixels, at least one of the sub-pixels in the image acquiring region has an opaque display zone and a transparent zone, and the camera is disposed on a side, facing away from the pixel units, of the substrate of the electroluminescent display panel.

17 Claims, 8 Drawing Sheets

(51) Int. Cl.
| | | |
|---|---|---|
| *G09G 3/3225* | (2016.01) | |
| *G09G 3/20* | (2006.01) | |
| *H01L 51/52* | (2006.01) | |
| *H01L 51/00* | (2006.01) | |

(52) U.S. Cl.
CPC ...... *H01L 27/3246* (2013.01); *H01L 51/0096* (2013.01); *H01L 51/5231* (2013.01); *H01L 51/5234* (2013.01); *G09G 2300/0439* (2013.01); *H01L 27/3234* (2013.01); *H01L 51/5218* (2013.01)

(58) Field of Classification Search
CPC ............. H01L 51/5218; H01L 27/3218; H01L 27/3211; G09G 3/3208; G09G 3/3225; G09G 3/2074; G09G 2300/0426; G09G 2360/14; G09G 2300/0439; G09G 2340/0407; Y02E 10/549
See application file for complete search history.

(56) References Cited

U.S. PATENT DOCUMENTS

| | | | |
|---|---|---|---|
| 8,860,011 B2* | 10/2014 | Fujii | H01L 27/3267 257/40 |
| 10,276,640 B2* | 4/2019 | Chung | H01L 51/5271 |
| 10,361,391 B2* | 7/2019 | Kim | H01L 27/3258 |
| 10,565,925 B2* | 2/2020 | Perdices-Gonzalez | G09G 3/2092 |
| 10,566,404 B2* | 2/2020 | Sato | H01L 27/3246 |
| 2009/0141116 A1* | 6/2009 | Kanade | H04N 5/2254 348/14.01 |
| 2012/0146065 A1* | 6/2012 | Fujii | H01L 33/44 257/88 |
| 2012/0153321 A1 | 6/2012 | Chung et al. | |
| 2012/0162271 A1* | 6/2012 | Hsieh | H01L 27/3267 345/690 |
| 2017/0070679 A1* | 3/2017 | Chung | G06F 1/1605 |
| 2017/0301288 A1* | 10/2017 | Perdices-Gonzalez | G09G 3/3225 |
| 2018/0090551 A1* | 3/2018 | Sato | H01L 51/5218 |
| 2018/0190935 A1* | 7/2018 | Kim | H01L 27/326 |
| 2018/0212179 A1 | 7/2018 | Yu | |
| 2019/0094637 A1 | 3/2019 | Liu et al. | |

* cited by examiner

DISPLAY APPARATUS, ELECTROLUMINESCENT DISPLAY PANEL AND METHOD OF ACQUIRING AND DISPLAYING IMAGE BY DISPLAY APPARATUS

CROSS-REFERENCE TO RELATED APPLICATION

This application is a Section 371 National Stage Application of International Application No. PCT/CN2018/096126, filed on Jul. 18, 2018, entitled "DISPLAY APPARATUS. ELECTROLUMINESCENT DISPLAY PANEL AND METHOD OF ACQUIRING AND DISPLAYING IMAGE BY DISPLAY APPARATUS", which published as WO2019/015605 A1 on 24 Jan. 2019 which claims priority to Chinese Application No. 201710602326.5, filed on Jul. 21, 2017, incorporated herein by reference in their entirety.

TECHNICAL FIELD

The present disclosure relates to the field of display technology, and particularly to a display apparatus, an electroluminescent display panel and a method of acquiring and displaying an image by the display apparatus.

BACKGROUND

At present, a demand of the market for a screen ratio of display products is increasingly high. It is hoped that a display has a screen ratio of more than 90% or even 100%. However, in existing display products, such as mobile phones, a non-display area is needed in order to provide a front camera module, so that a large-screen design or a full-screen design cannot be achieved. On the other hand, even if in the display products, the front camera module can be placed in a display area, a region where a display cannot be carried out is formed in the display area to adversely affect continuity of the display, which is unfavorable to a display effect. Thus, it is a technical problem to be solved urgently in the art how to achieve the full-screen design with no influence on the display.

SUMMARY

Embodiments of the present disclosure provide a display apparatus comprises: an electroluminescent display panel; and a camera disposed in an image acquiring region of the electroluminescent display panel, wherein the electroluminescent display panel comprises: a substrate; and a plurality of pixel units disposed in a display area on the substrate and each comprising at least two sub-pixels, wherein: the display area has the image acquiring region comprising the sub-pixels, at least one of the sub-pixels in the image acquiring region has an opaque display zone and a transparent zone, and each of the sub-pixels comprises an organic light-emitting structure and a control circuit connected with the organic light-emitting structure; the control circuit is disposed only in the opaque display zone and the organic light-emitting structure is disposed at least in the opaque display zone; and the camera is disposed on a side, facing away from the pixel units, of the substrate of the electroluminescent display panel.

In an embodiment, the organic light-emitting structure comprises: an anode, an electroluminescent material and a cathode, which are stacked in sequence on the substrate; and a portion of the anode in the opaque display zone is a reflecting electrode and is electrically connected with the control circuit, and the cathode is a transparent electrode.

In an embodiment, the display apparatus further comprises: a processor configured to process an image acquired by the camera and displayed at a first resolution, to display the processed image at a second resolution, wherein the first resolution is a multiple of the second resolution.

Embodiments of the present disclosure further provide an electroluminescent display panel comprising: a substrate; and a plurality of pixel units disposed in a display area on the substrate and each comprising at least two sub-pixels, wherein: the display area has an image acquiring region comprising the sub-pixels, at least one of the sub-pixels in the image acquiring region has an opaque display zone and a transparent zone, and each of the sub-pixels comprises an organic light-emitting structure and a control circuit connected with the organic light-emitting structure; and the control circuit is disposed only in the opaque display zone and the organic light-emitting structure is disposed at least in the opaque display zone.

In an embodiment, the organic light-emitting structure comprises: an anode, an electroluminescent material and a cathode, which are stacked in sequence on the substrate; and a portion of the anode in the opaque display zone is a reflecting electrode and is electrically connected with the control circuit, and the cathode is a transparent electrode.

In an embodiment, the electroluminescent materials of the sub-pixels in each of the pixel units are configured to emit lights of different colors.

In an embodiment, the electroluminescent materials of the sub-pixels in each of the pixel units are configured to emit white lights; the organic light-emitting structure further comprises: a color filter on a side of the cathode facing away from the electroluminescent material; and the color resistances of the sub-pixels in each of the pixel units have different colors.

In an embodiment, the plurality of pixel units are arranged in an array.

In an embodiment, in the image acquiring region, the opaque display zone and the transparent zone of each of the sub-pixels are arranged in a column direction, the opaque display zones in each row of sub-pixels are arranged in a same position, and the transparent display zones in each row of sub-pixels are arranged in a same position; the opaque display zones in each odd-numbered row of sub-pixels and the opaque display zones in each even-numbered row of sub-pixels are arranged in different positions, and the transparent zones in each odd-numbered row of sub-pixels and the transparent zones in each even-numbered row of sub-pixels are arranged in different positions; and the opaque display zones or the transparent zones in every two adjacent rows of sub-pixels are disposed adjacent to each other.

In an embodiment, in the image acquiring region, the opaque display zone and the transparent zone of each of the sub-pixels are arranged in a row direction, the opaque display zones in each column of sub-pixels are arranged in a same position, and the transparent zones in each column of sub-pixels are arranged in a same position; the opaque display zones in each odd-numbered column of sub-pixels and the opaque display zones in each even-numbered column of sub-pixels are arranged in different positions, and the transparent zones in each odd-numbered column of sub-pixels and the transparent zones in each even-numbered column of sub-pixels are arranged in different positions; and the opaque display zones or the transparent zones in every two adjacent columns of sub-pixels are disposed adjacent to each other.

In an embodiment, the organic light-emitting structure is disposed in both the opaque display zone and the transparent zone.

In an embodiment, the organic light-emitting structure is disposed only in the opaque display zone.

In an embodiment, the organic light-emitting structure further comprises: a pixel defining layer which separates both the portion of the anode and a portion of the electroluminescent material in the opaque display zone from both a portion of the anode and a portion of the electroluminescent material in the transparent zone.

In an embodiment, the transparent zone occupies 30%-70% of an area of the sub-pixel.

Embodiments of the present disclosure further provide a method of acquiring and displaying an image by the above display apparatus, comprising: acquiring, by the camera, an image having a first resolution while no picture is displayed through the sub-pixels in the image acquiring region of the electroluminescent display panel; and displaying the acquired image at a second resolution, wherein the first resolution is a multiple of the second resolution.

In an embodiment, displaying the acquired image at the second resolution comprises: by assuming that at least every two adjacent pixels in the image having the first resolution are a set of pixels, displaying sub-pixels of each color in each set of pixels, at an average of the sub-pixels of the each color.

In an embodiment, displaying the acquired image at the second resolution comprises: displaying ones, having a luminance greater than a preset luminance threshold value, of pixels in the image having the first resolution.

In an embodiment, displaying the acquired image at the second resolution comprises: obtaining a transition image by removing ones, having a luminance less than a preset luminance threshold value, of the pixels in the image having the first resolution; and by assuming that at least every two adjacent pixels in the transition image are a set of pixels, displaying sub-pixels of each color in each set of pixels, at an average of the sub-pixels of the each color.

DETAILED DESCRIPTION

Embodiments of a display apparatus, an electroluminescent display panel and a method of acquiring and displaying an image by the display apparatus according to embodiments of the present disclosure will be described hereinafter in detail in conjunction with the accompanying drawings.

Shapes and sizes of these films shown in the accompanying drawings do not reflect real proportion of the electroluminescent display panel, but are intended only to illustrate the contents of this disclosure.

Figure 1:
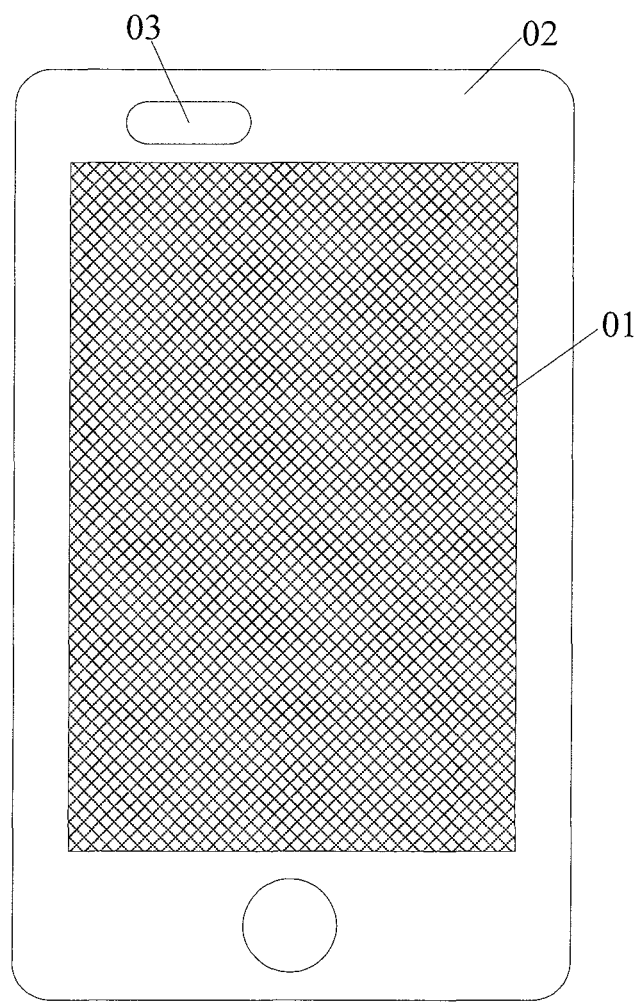
FIGS. 1 and 2 are schematic views showing a structure of a display product in the prior art, respectively.
Figure 2:
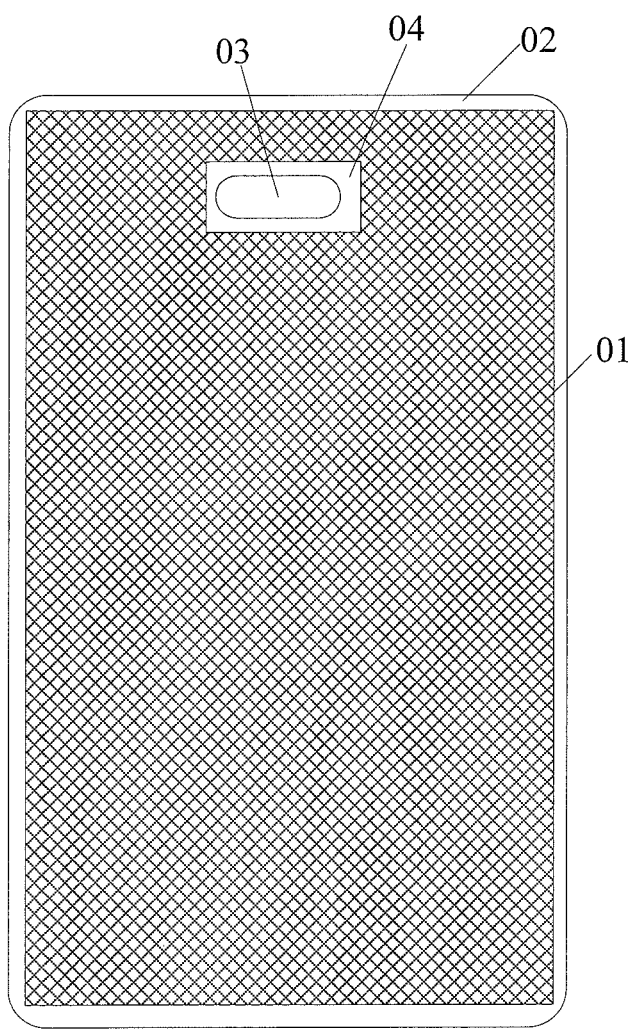

In a mobile phone as shown in FIG. 1, a non-display area 02 is needed in order to provide a front camera module 03, so that a large-screen design or a full-screen design cannot be achieved. A corresponding island-shaped perforated region 04 is disposed in a display area 01 of a display product as shown in FIG. 2, to provide the front camera module 03 in the display area 01. Although the front camera module 03 can be placed in the display area 01 to avoid a non-display area design, the island-shaped perforated region 04 where a display cannot be carried out is formed in the display area 01 to adversely affect continuity of the display, which is unfavourable to a display effect.

Figure 3:
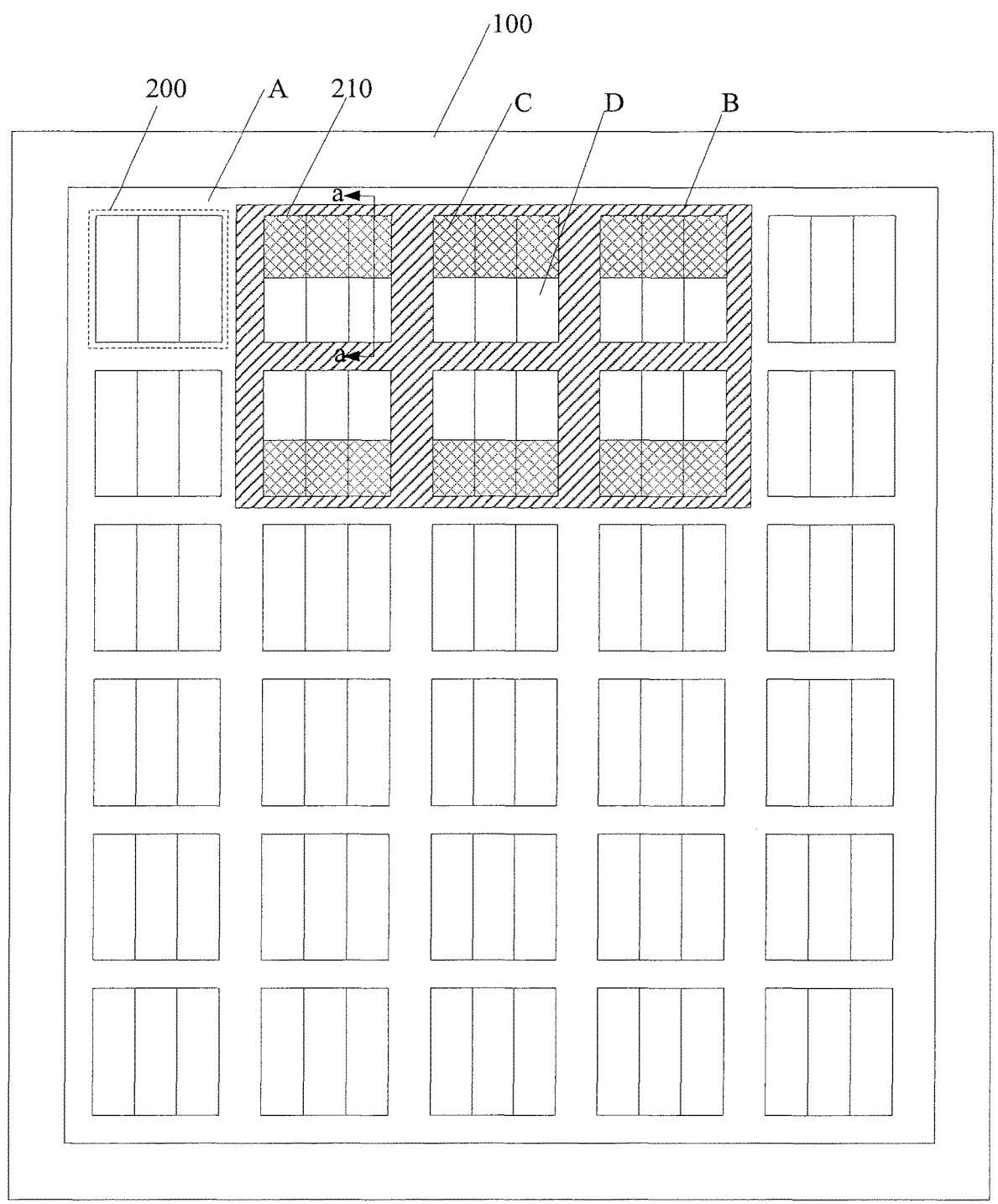
FIG. 3 is a schematic view showing a structure of an electroluminescent display panel according to an embodiment of the present disclosure.
Figure 6:
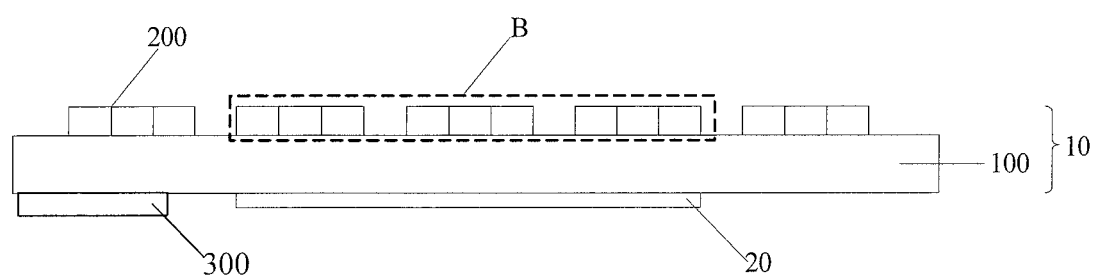
FIG. 6 is a schematic view showing a structure of a display apparatus according to an embodiment of the present disclosure.

Embodiments of the present disclosure provide a display apparatus as shown in FIG. 6. The display apparatus includes: an electroluminescent display panel 10 as shown in FIGS. 3 and 4b; and a camera 20 disposed in an image acquiring region of the electroluminescent display panel. The electroluminescent display panel includes: a substrate 100; and a plurality of pixel units 200 disposed in a display area A on the substrate and each including at least two sub-pixels 210. The display area A has an image acquiring region B including the sub-pixels, at least one of the sub-pixels in the image acquiring region B has an opaque display zone C and a transparent zone D, and each of the sub-pixels 210 includes an organic light-emitting structure 211 and a control circuit 212 connected with the organic light-emitting structure 211. The control circuit 212 is disposed only in the opaque display zone C and the organic light-emitting structure is disposed at least in the opaque display zone C. The camera 20 is disposed on a side, facing away from the pixel units 200, of the substrate 100 of the electroluminescent display panel.

In an embodiment, the organic light-emitting structure 211 includes: an anode 2111, an electroluminescent material 2112 and a cathode 2113, which are stacked in sequence on the substrate 100; and a portion of the anode 2111 in the opaque display zone C is a reflecting electrode and is electrically connected with the control circuit 212, and the cathode 2113 is a transparent electrode.

In an embodiment, the display apparatus further includes a processor 300 configured to process an image acquired by the camera 20 and displayed at a first resolution, to display the processed image at a second resolution. The first resolution is a multiple of the second resolution.

Figure 4A:
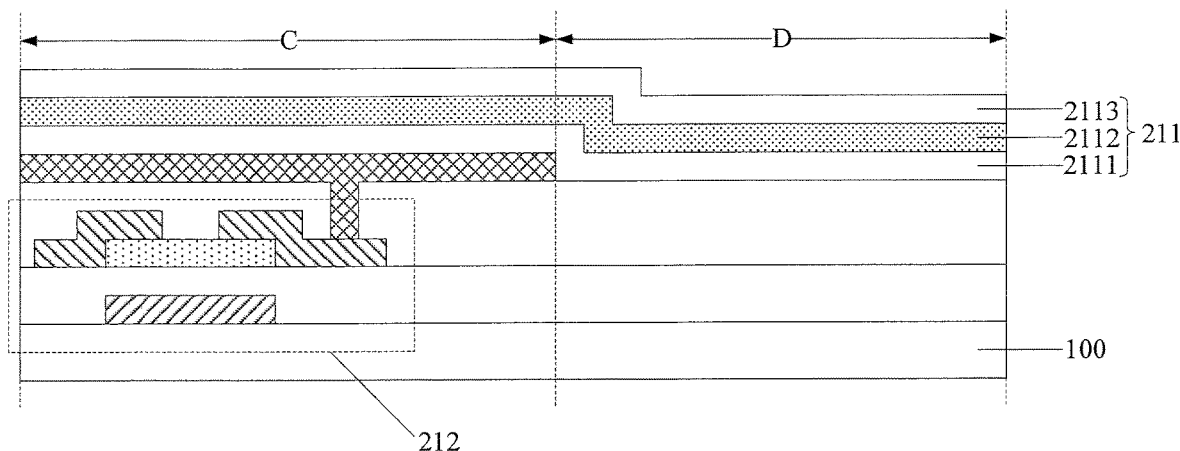
FIGS. 4a, 4b and 4c are schematic section views taken along the line aa in FIG. 3, respectively.
Figure 4B:
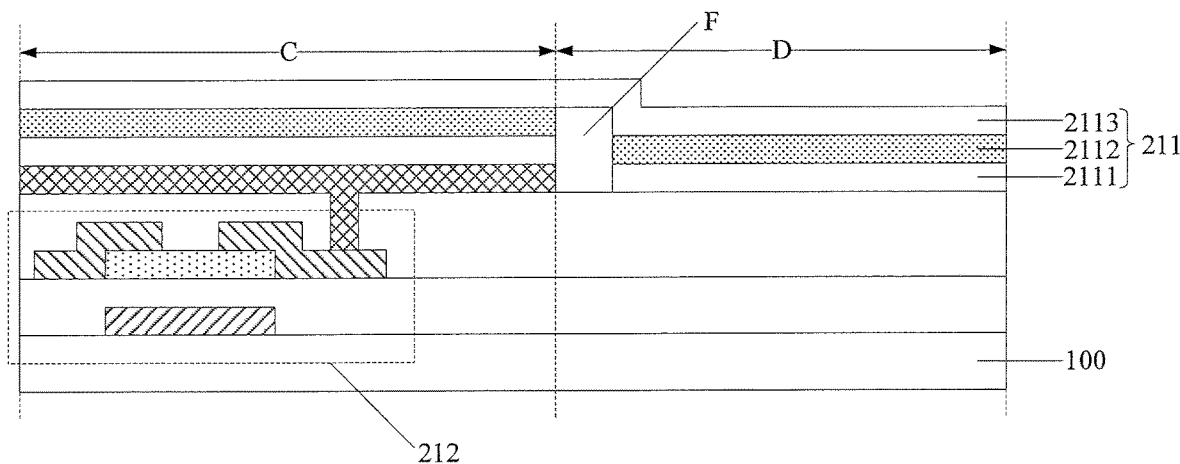

As shown in FIGS. 3 and 4a, an electroluminescent display panel according to the embodiments of the present disclosure includes: a substrate 100; and a plurality of pixel units 200 disposed in a display area A on the substrate 100, arranged in an array, and each including at least two sub-pixels 210. The display area A has an image acquiring region B including the sub-pixels 210. A camera 20 is disposed under the image acquiring region B (the phase "under the image acquiring region B" as used herein means that the camera 20 is on a side of the substrate 100 facing away from the pixel units 200. The camera acquires an image through the image acquiring region B.

Each of the sub-pixels 210 in the image acquiring region B has an opaque display zone C and a transparent zone D, and each of the sub-pixels 210 includes an organic light-emitting structure 211 and a control circuit 212 connected with the organic light-emitting structure 211. The control circuit 212 is disposed only in the opaque display zone C and the organic light-emitting structure 211 is disposed at least in the opaque display zone C.

Specifically, in the electroluminescent display panel according to the embodiments of the present disclosure, each of the sub-pixels 210 in the image acquiring region B is divided into the opaque display zone C and the transparent zone D. Thereby, the camera placed under the image acquiring region B can acquire an image through the transparent zone D, so that a camera function is achieved in the display area A, which is favorable to an achievement of a full-screen display design. Further, the control circuit 212 of each of the sub-pixels 210 in the image acquiring region B is disposed only in the opaque display zone C, and the organic light-emitting structure 211 electrically connected with the control circuit 212 is disposed in both the transparent zone D and the opaque display zone C. Therefore, a display function is achieved in both the transparent zone D and the opaque display zone C while it is ensure that the transparent zone D is light-transmissible, with no adverse influence on a normal display of the display panel, thereby guaranteeing continuity of the display.

In a specific implementation, in the electroluminescent display panel according to the embodiments of the present disclosure, a size of the image acquiring region B in the display area A may be set according to the required number of cameras, to determine the number of the sub-pixels 210 included in the image acquiring region B. Furthermore, the number of the image acquiring regions B is not limited herein, and may be one, or else may also be two or more.

In a specific implementation, in the electroluminescent display panel according to the embodiments of the present disclosure, generally the transparent zone D occupies 30%-70% of a total area of the sub-pixel 210. A specific value needs to be set according to actual requirements.

In a specific implementation, in the electroluminescent display panel according to the embodiments of the present disclosure, as shown in FIG. 4a, the organic light-emitting structure 211 specifically includes: an anode 2111, an electroluminescent material 2112 and a cathode 2113, which are stacked in sequence on the substrate 100; and a portion of the anode 2111 in the opaque display zone C is a reflecting electrode and is electrically connected with the control circuit 212, and the cathode 2113 is a transparent electrode.

In a specific implementation, in the electroluminescent display panel according to the embodiments of the present disclosure, the organic light-emitting structure 211 may be disposed only in the opaque display zone C. In other words, the organic light-emitting structure 211 is not disposed in the transparent zone D. In this way, when a display is performed, no light is emitted in the transparent area D. When this structure is manufactured, a separate patterning is needed to be performed on each of the anode 2111, the electroluminescent material 2112, and the cathode 2113.

Figure 4C:
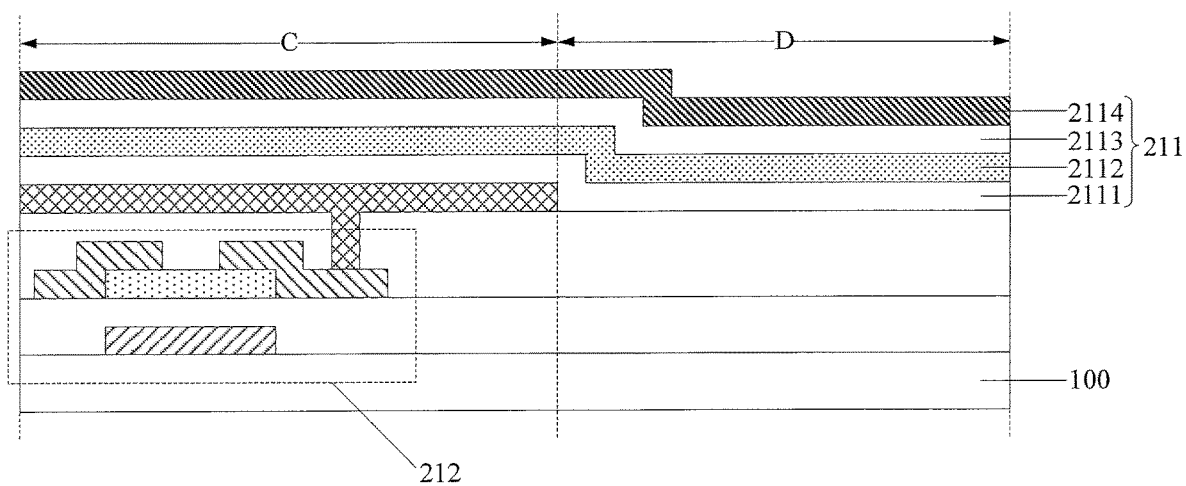

Or, in the electroluminescent display panel according to the embodiments of the present disclosure, as shown in FIGS. 4a and 4c, the organic light-emitting structure 211 may also be disposed in both the opaque display zone C and the transparent zone D. In this way, when a display is performed, light is emitted in both the opaque display zone C and the transparent area D. When this structure is manufactured, no separate patterning is needed to be performed on each of the electroluminescent material 2112 and the cathode 2113.

Or, in the electroluminescent display panel according to the embodiments of the present disclosure, as shown in FIG. 4b, the organic light-emitting structure 211 may be disposed in both the opaque display zone C and the transparent zone D, and a pixel defining layer F is used to separate both the portion of the anode 2111 and a portion of the electroluminescent material 2112 in the opaque display zone C from a portion of the anode 2111 and a portion of the electroluminescent material 2112 in the transparent zone D. In other words, it is ensured that no light is emitted in the transparent area D when a display is performed. When this structure is manufactured, no separate patterning is needed to be performed on each of the anode 2111, the electroluminescent material 2112, and the cathode 2113.

It is to be noted that in the electroluminescent display panel according to the embodiments of the present disclosure, all types of organic light-emitting structures 211 or only one or two types of organic light-emitting structures 211, of the above three types of organic light-emitting structures 211 may be included, and there is no limitation on specifics about the included types of organic light-emitting structures herein.

Specifically, the anode 2111 may be disposed in a multiple-film structure. For example, as shown in FIG. 4a, the anode 2111 may include a reflection film disposed in the opaque display zone C, and a transparent electrode film disposed in both the opaque display zone C and the transparent zone D.

Furthermore, in addition to the anode 2111, the electroluminescent material 2112 and the cathode 2113, the organic light-emitting structure 211 may include other functional films. For example, the organic light-emitting structure 211 may further include a hole transport layer, an electronic barrier layer, and the like between the anode 2111 and the electroluminescent material 2112, which will not be described in detail.

In a specific implementation, in the electroluminescent display panel according to the embodiments of the present disclosure, the electroluminescent materials 2112 of the sub-pixels 210 in each of the pixel units 200 are configured to emit lights of different colors. In other words, the electroluminescent materials 2112 of the sub-pixels 210 in each of the pixel units 200 are different and need to be manufactured separately. For example, the electroluminescent materials 2112 of the sub-pixels 210 in each of the pixel units 200 may be configured to emit a red light, a green light, a blue light, and the like.

Alternatively, in a specific implementation, in the electroluminescent display panel according to the embodiments of the present disclosure, the electroluminescent materials 2112 of the sub-pixels 210 in each of the pixel units 200 are configured to emit white lights. In other words, the electroluminescent materials 2112 of the sub-pixels 210 are the same and may be manufactured simultaneously. In this case, in order to achieve different colors of the sub-pixels 210, as shown in FIG. 4c, the organic light-emitting structure 211 may further include: a color filter 2114 on a side of the cathode 2113 facing away from the electroluminescent material 2112; and the color filters 2114 of the sub-pixels 210 in each of the pixel units 200 have different colors, and for example may include red, blue and green filter 2114.

In a specific implementation, in the electroluminescent display panel according to the embodiments of the present disclosure, an existence of the opaque display zone C in the image acquiring region B will obstruct and interfere with an acquisition of an image by the camera under the image acquiring region B. In order to reduce an adverse influence on the acquisition of the image by the camera under the image acquiring region, positions of the opaque display zones C and the transparent display zones D may be adjusted so that the opaque display zones C and the transparent display zones D are combined into a continuous large-area light-intransmissible section and a continuous large-area light-transmissible section as far as possible, thereby facilitating a subsequent image processing.

Figure 5A:
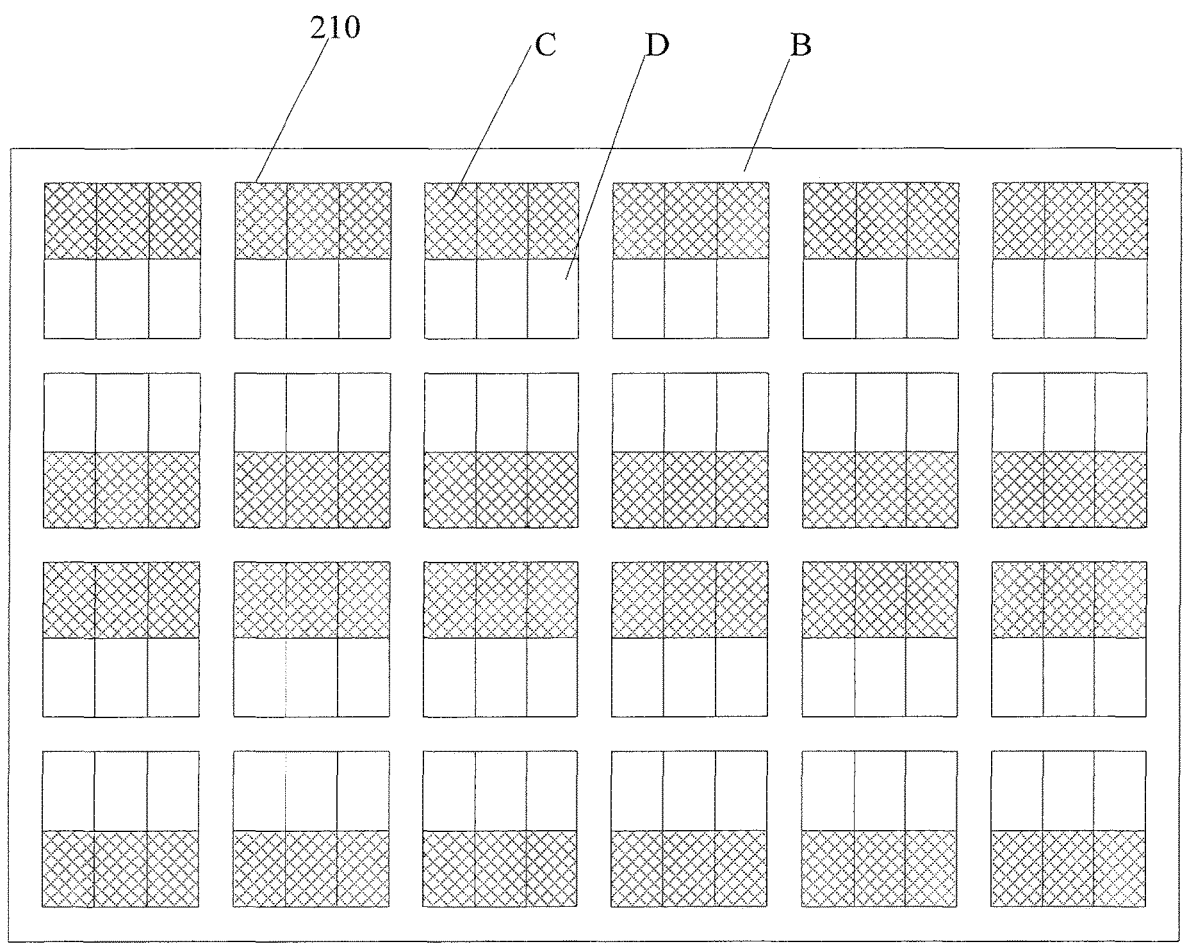
FIGS. 5a and 5b are schematic views showing structures of an image acquiring region in the electroluminescent display panel according to an embodiment of the present disclosure, respectively.

Based on this concept, in a specific implementation, in the electroluminescent display panel according to the embodiments of the present disclosure, as shown in FIG. 5a, in the image acquiring region B, when the opaque display zone C and the transparent zone D of each of the sub-pixels 210 are arranged in a column direction, the opaque display zones C in each odd-numbered row of sub-pixels 210 may be arranged in a same position, and the transparent zones D in each odd-numbered row of sub-pixels 210 are arranged in a same position; and the opaque display zones C in each even-numbered row of sub-pixels 210 may be arranged in a same position, and the transparent zones D in each even-numbered row of sub-pixels 210 are arranged in a same position, so that the opaque display zones C or the transparent zones D in every two adjacent rows of sub-pixels 210 may be disposed adjacent to each other, forming substantially continuous large-area light-intransmissible and light-transmissible sections in rows. For example, in FIG. 5a, three light-intransmissible sections and two light-transmissible sections are formed, thereby facilitating a subsequent processing of an image.

Figure 5B:
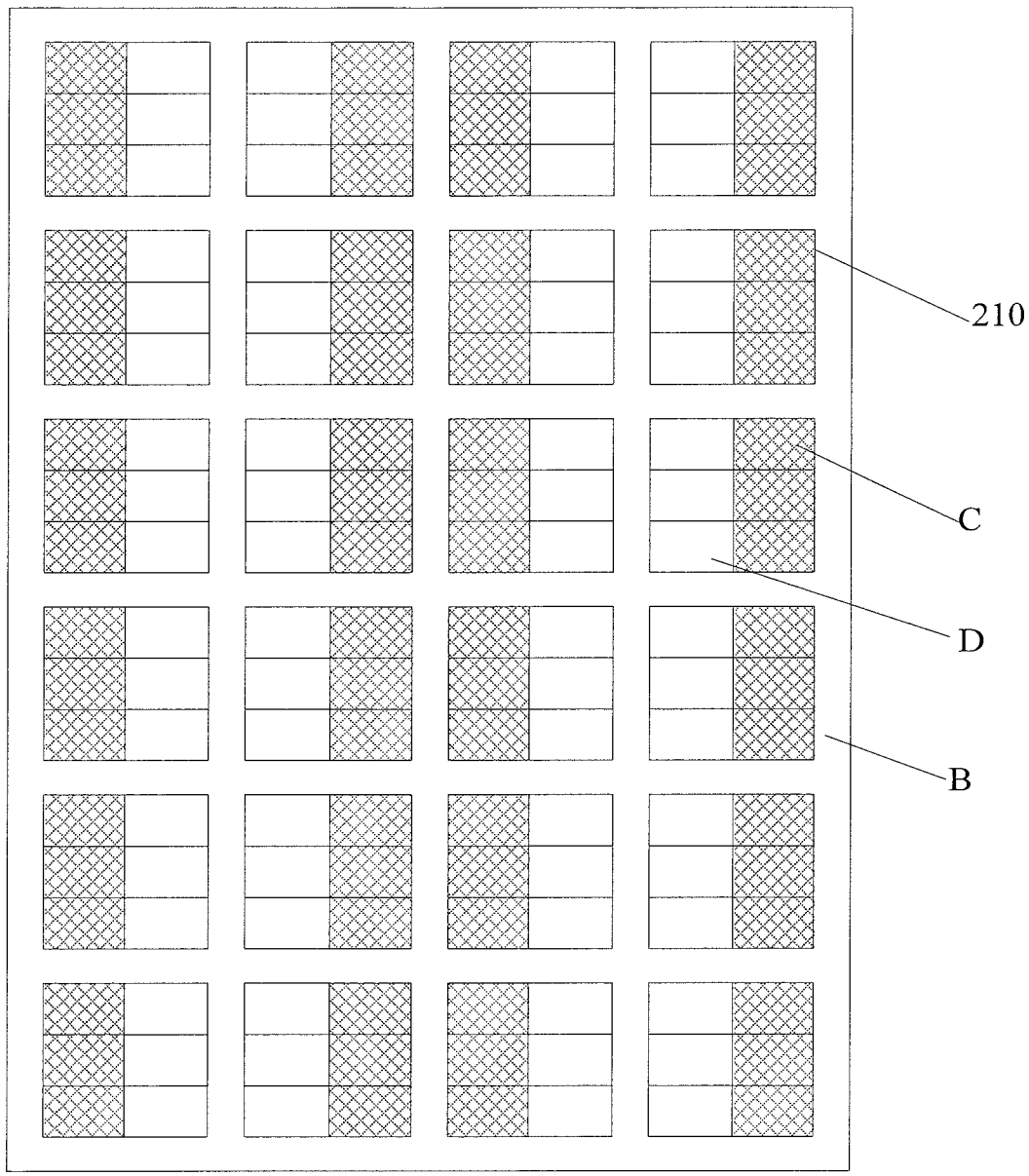

Alternatively, in a specific implementation, in the electroluminescent display panel according to the embodiments of the present disclosure, as shown in FIG. 5b, in the image acquiring region B, when the opaque display zone C and the transparent zone D of each of the sub-pixels 210 are arranged in a row direction, the opaque display zones C in each odd-numbered column of sub-pixels 210 may be arranged in a same position, and the transparent zones D in each odd-numbered column of sub-pixels 210 are arranged in a same position; and the opaque display zones C in each even-numbered column of sub-pixels 210 may be arranged in a same position, and the transparent zones D in each even-numbered column of sub-pixels 210 are arranged in a same position, so that the opaque display zones C or the transparent zones D in every two adjacent columns of sub-pixels 210 may be continuously arranged, forming continuous large-area light-intransmissible and light-transmissible sections. For example, in FIG. 5b, three light-intransmissible sections and two light-transmissible sections are formed, thereby facilitating a subsequent processing of an image.

Embodiments of the present disclosure provide a display apparatus. The display apparatus may include any products or parts having a displaying function, such as a mobile phone, a tablet computer, a TV, a display, a notebook computer, a digital frame, and a navigator. The embodiments of the electroluminescent display panel may be referred to for implementations of the display apparatus and repeated contents are no longer described for the sake of brevity.

Specifically, as shown in FIG. 6, a display apparatus according to embodiments of the present disclosure includes: the electroluminescent display panel 10 according to the embodiments of the present disclosure; and a camera 20 disposed in an image acquiring region B of the electroluminescent display panel 10.

The camera 20 is disposed on a side, facing away from the pixel units 200, of the substrate 100 of the electroluminescent display panel 10.

Specifically, in the display apparatus according to the embodiments of the present disclosure, the number of the camera(s) 20 may be one or more and is specifically set according to actual requirements, and one or more cameras 20 may be disposed in the same image acquiring region B. The number of the camera(s) 20 and the number of the camera(s) 20 disposed in the same image acquiring region B are not limited herein.

Specifically, in the display apparatus according to the embodiments of the present disclosure, the camera placed under the image acquiring region B acquires an image through the transparent zone D, so that a camera function is achieved in the display area A, which is favorable to an achievement of a full-screen display design.

Figure 7:
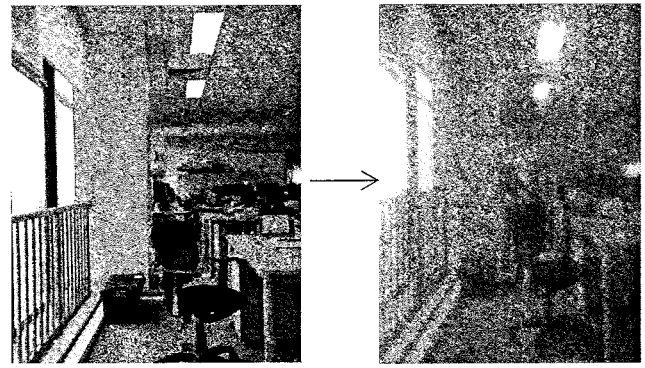
FIG. 7 shows images acquired by cameras, for comparison.

However, due to an obstruction of the opaque display zone C in the image acquiring region B, as shown in FIG. 7, an image acquired by the camera 20 through the electroluminescent display panel 10 are blurred as shown in the right figure in FIG. 7, while the left figure in FIG. 7 is an image taken by the same camera without an obstruction of the electroluminescent display panel 10.

Figure 8:
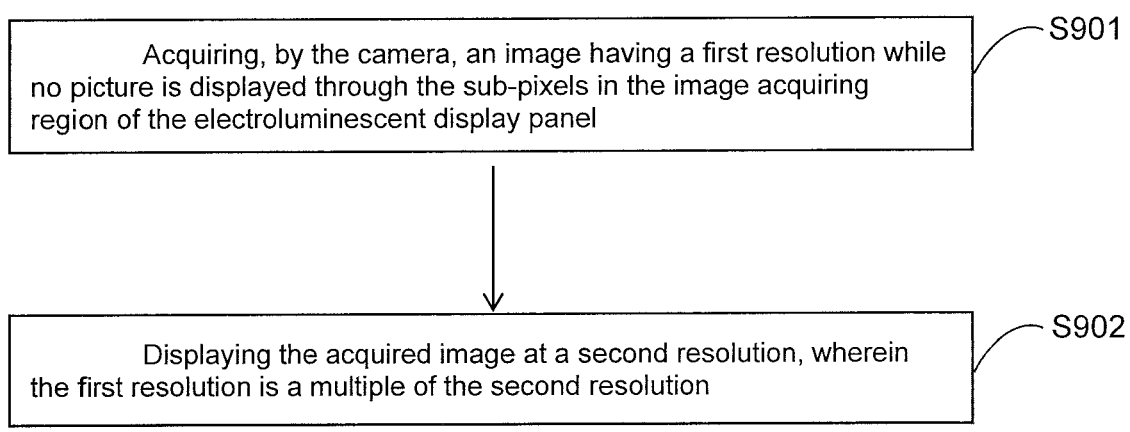
FIG. 8 is a flow diagram of a method of acquiring and displaying an image by the display apparatus according to the embodiment of the present disclosure.

In view of this, the image acquired by the display apparatus according to the embodiment of the present disclosure cannot be directly displayed, and needs to be subjected to a processing to ensure that a clear image can be displayed. Therefore, embodiments of the present disclosure further provide a method of acquiring and displaying an image by the above display apparatus. As shown in FIG. 8, the method includes the following steps.

In a step S901, an image having a first resolution is acquired by the camera while no picture is displayed through the sub-pixels in the image acquiring region of the electroluminescent display panel. In other words, when a shoot needs to be performed by the camera, a displaying of a picture in the image acquiring region is stopped. After the shoot is completed, the display of the picture in the image acquiring region is resumed. In this way, an adverse influence of the displaying of the picture on the acquisition of the image by the camera can be reduced.

In a step S902, the acquired image is displayed at a second resolution. The first resolution is a multiple of the second resolution.

Figure 9:
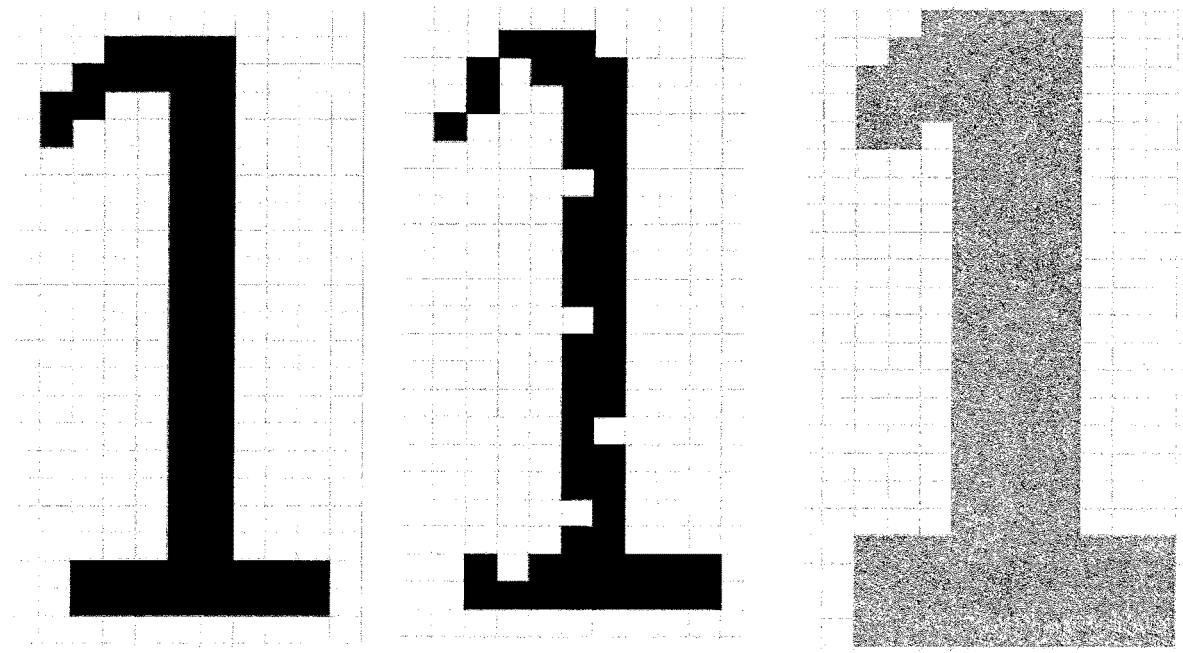
FIG. 9 is a simulated schematic diagram showing an image displayed by the method of acquiring and displaying an image by the display apparatus according to the embodiment of the present invention.

Specifically, in the method according to the embodiments of the present disclosure, as schematically shown in FIG. 9, the left figure is an original image taken by the camera, and the middle figure is an image taken by the camera placed under the image acquiring region. When the image acquired by the camera placed under the image acquiring region is displayed, it is displayed by reducing a resolution of the image, so that the high-resolution blurred image is converted into the low-resolution clear image as the resolution-reduced image shown in the right figure in FIG. 9. In this way, a clarity of the image can be improved.

In a specific implementation, in the method according to the embodiments of the present disclosure, there are many processing manners to reduce the resolution of the image having the first resolution.

Figure 10:
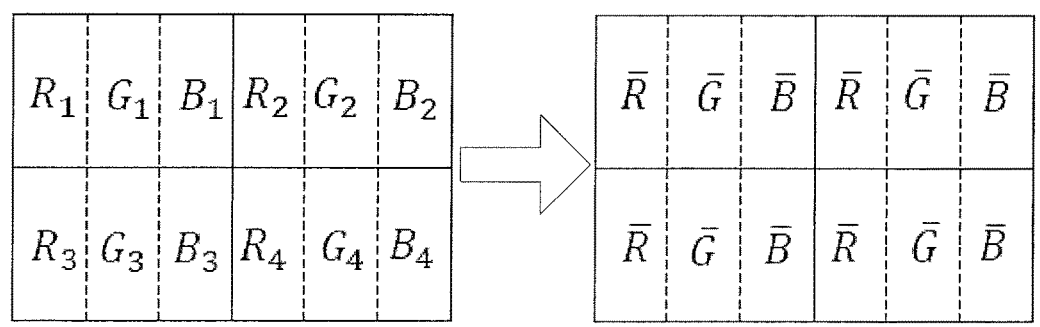
FIG. 10 is a schematic diagram showing a resolution reducing manner in the method of acquiring and displaying an image by the display apparatus according to the embodiment of the present disclosure.

Specifically, in the method according to the embodiments of the present disclosure, a specific implementation manner of displaying the acquired image at the second resolution in the step S902 may specifically include:

by assuming that at least every two adjacent pixels in the image having the first resolution are a set of pixels, displaying sub-pixels of each color in each set of pixels, at an average of the sub-pixels of the each color. For example, as shown in FIG. 10, 2*2 pixels are combined into a set of pixels. The left figure is the image having the first resolution, while the right figure is the image having the second resolution. The red sub-pixels is displayed at a gray scale value of the red sub-pixels which is an average of the red sub-pixels, namely, $$\overline{R} = \frac{R_1 + R_2 + R_3 + R_4}{4},$$

the blue sub-pixels is displayed at a gray scale value of the blue sub-pixels which is an average of the blue sub-pixels, namely, $$\overline{B} = \frac{B_1 + B_2 + B_3 + B_4}{4},$$

and the green sub-pixels is displayed at a gray scale value of the green sub-pixels which is an average of the green sub-pixels, namely, $$\overline{G} = \frac{G_1 + G_2 + G_3 + G_4}{4}.$$

Specifically, in the method according to the embodiments of the present disclosure, another specific implementation manner of displaying the acquired image at the second resolution in the step S902 may specifically include:

displaying ones, having a luminance greater than a preset luminance threshold value, of pixels in the image having the first resolution. In this way, ones, having a low luminance value and located at positions obstructed by the opaque display zones, of the pixels in the image having the first resolution may be removed so that the others of the pixels are displayed for the image.

Specifically, in the method according to the embodiments of the present disclosure, a further specific implementation manner of displaying the acquired image at the second resolution in the step S902 may specifically include:

obtaining a transition image by removing ones, having a luminance less than a preset luminance threshold value, of the pixels in the image having the first resolution; and by assuming that at least every two adjacent pixels in the transition image are a set of pixels, displaying sub-pixels of each color in each set of pixels, at an average of the sub-pixels of the each color.

In this way, ones, having a low luminance value and located at positions obstructed by the opaque display zones, of the pixels in the image having the first resolution may be first removed, and then in combination with the above first specific implementation manner, the rest of the pixels are divided into sets of pixels, so that each set of pixels are displayed at averages of the each set of pixels for the image.

It is to be noted that the above three resolution reducing manners according to the embodiments of the present disclosure are only illustrative, and there may also be other resolution reducing manners which are not described herein for the sake of brevity.

With the electroluminescent display panel, the display apparatus, and the method of acquiring and displaying an image by the display apparatus, the image acquiring region is disposed in the display area, and each of the sub-pixels in the image acquiring region is divided into the opaque display zone and the transparent zone. Thereby, the camera placed under the image acquiring region can acquire an image through the transparent zone, so that a camera function is achieved in the display area, which is favorable to an achievement of a full-screen display design. Further, the control circuit of each of the sub-pixels in the image acquiring region is disposed only in the opaque display zone, and the organic light-emitting structure electrically connected with the control circuit is disposed at least in the opaque display zone. Therefore, a display function is achieved in both the transparent zone and the opaque display zone while it is ensured that the transparent zone is light-transmissible, with no adverse influence on a normal display of the display panel, thereby guaranteeing continuity of the display. Furthermore, when the image acquired by the camera placed under the image acquiring region is displayed, it may be displayed by reducing a resolution of the image, to improve a clarity of the image.

Apparently, various changes and modifications to the present disclosure may be made by those skilled in the art without departing from the spirit and scope of the disclosure. Therefore, if these amendments and modifications to the present disclosure belong to the scope defined in the appended claims of the present disclosure and their equivalents, the present disclosure is intended to include the changes and modifications.

What is claimed is:

1. A display apparatus comprising:
an electroluminescent display panel; and a camera, wherein:
the electroluminescent display panel comprises:
a substrate comprising a display area; and
a plurality of sub-pixels disposed in the display area,
wherein the display area has at least one image acquiring region comprising continuous ones of the plurality of sub-pixels, and at least one of the sub-pixels in the image acquiring region has an opaque display zone and a transparent zone which is configured to enable the camera to acquire an image;
wherein the camera is disposed on a side, facing away from the plurality of sub-pixels, of the substrate of the electroluminescent display panel;
wherein an orthogonal projection of the camera on the substrate at least partly overlaps an orthogonal projection of the transparent zones in the image acquiring region on the substrate; and
wherein each of the sub-pixels in the image acquiring region comprises an organic light-emitting structure, and the organic light-emitting structure is disposed in both the opaque display zone and the transparent zone, such that the organic light-emitting structure emits a light in both the opaque display zone and the transparent zone so that a display function is achieved in both the transparent zone and the opaque display zone.

2. The display apparatus of claim 1, wherein:
each of the sub-pixels in the image acquiring region further comprises a control circuit connected with the organic light-emitting structure.

3. The display apparatus of claim 2, wherein:
the control circuit is disposed only in the opaque display zone.

4. The display apparatus of claim 2, wherein:
the organic light-emitting structure comprises: an anode, an electroluminescent material and a cathode, which are stacked in sequence on the substrate; and
a portion of the anode in the opaque display zone is a reflecting electrode and is electrically connected with the control circuit, and the cathode is a transparent electrode.

5. The display apparatus of claim 1, further comprising:
a processor configured to process an image acquired by the camera and having a first resolution, to display the processed image at a second resolution, wherein the first resolution is a multiple of the second resolution.

6. The display apparatus of claim 1, wherein:
the orthogonal projection of the camera on the substrate overlaps an orthogonal projection of the image acquiring region on the substrate.

7. A method of acquiring and displaying an image by the display apparatus of claim 1, the method comprising:
acquiring, by the camera, an image having a first resolution while no picture is displayed through the sub-pixels in the image acquiring region of the electroluminescent display panel; and
displaying the acquired image at a second resolution, wherein the first resolution is a multiple of the second resolution.

8. The method of claim 7, wherein:
displaying the acquired image at the second resolution comprises:
by assuming that at least every two adjacent pixels in the image having the first resolution are a set of pixels, displaying sub-pixels of each color in each set of pixels, at an average of gray scale values of the sub-pixels of the each color.

9. The method of claim 7, wherein:
displaying the acquired image at the second resolution comprises:
displaying ones, having a luminance greater than a preset luminance threshold value, of pixels in the image having the first resolution.

10. The method of claim 7, wherein:
displaying the acquired image at the second resolution comprises:
obtaining a transition image by removing ones, having a luminance less than a preset luminance threshold value, of the pixels in the image having the first resolution; and by assuming that at least every two adjacent pixels in the transition image are a set of pixels, displaying sub-pixels of each color in each set of pixels, at an average of gray scale values of the sub-pixels of the each color.

11. An electroluminescent display panel comprising:
a substrate comprising a display area; and
a plurality of sub-pixels disposed in the display area, wherein the display area has at least one image acquiring region comprising continuous ones of the plurality of sub-pixels, and at least one of the sub-pixels in the image acquiring region has an opaque display zone and a transparent zone which is configured to enable a camera to acquire an image; and
wherein each of the sub-pixels in the image acquiring region comprises an organic light-emitting structure, and the organic light-emitting structure is disposed in both the opaque display zone and the transparent zone, such that the organic light-emitting structure emits a light in both the opaque display zone and the transparent zone so that a display function is achieved in both the transparent zone and the opaque display zone.

12. The electroluminescent display panel of claim 11, wherein:
each of the sub-pixels in the image acquiring region further comprises a control circuit connected with the organic light-emitting structure.

13. The electroluminescent display panel of claim 12, wherein:
the control circuit is disposed only in the opaque display zone.

14. The electroluminescent display panel of claim 12, wherein:
the organic light-emitting structure comprises: an anode, an electroluminescent material and a cathode, which are stacked in sequence on the substrate; and
a portion of the anode in the opaque display zone is a reflecting electrode and is electrically connected with the control circuit, and the cathode is a transparent electrode.

15. The electroluminescent display panel of claim 11, wherein:
in the image acquiring region,
the sub-pixels are arranged in an array, the opaque display zone and the transparent zone of each of the sub-pixels are arranged in a column direction, and the opaque display zones and the transparent zones of each row of sub-pixels are arranged in an array comprising a first sub-row and a second sub-row;
in each odd-numbered row of sub-pixels, the opaque display zones are arranged in one of the first sub-row and the second sub-row, and the transparent zones are arranged in the other of the first sub-row and the second sub-row;
in each even-numbered row of sub-pixels, the transparent zones are arranged in the one of the first sub-row and the second sub-row, and the opaque display zones are arranged in the other of the first sub-row and the second sub-row; and
the first or second sub-row of transparent zones in one row of sub-pixels of at least two adjacent rows of sub-pixels are disposed to be adjacent to the second or first sub-row of transparent zones in the other row of sub-pixels of the at least two adjacent rows of sub-pixels.

16. The electroluminescent display panel of claim 11, wherein:
in the image acquiring region, the sub-pixels are arranged in an array, the opaque display zone and the transparent zone of each of the sub-pixels are arranged in a row direction, and the opaque display zones and the transparent zones of each column of sub-pixels are arranged in an array comprising a first sub-column and a second sub-column;
in each odd-numbered column of sub-pixels, the opaque display zones are arranged in one of the first sub-column and the second sub-column, and the transparent zones are arranged in the other of the first sub-column and the second sub-column;
in each even-numbered column of sub-pixels, the transparent zones are arranged in the one of the first sub-column and the second sub-column, and the opaque display zones are arranged in the other of the first sub-column and the second sub-column; and
the first or second sub-column of transparent zones in one column of sub-pixels of at least two adjacent columns of sub-pixels are disposed to be adjacent to the second or first sub-column of transparent zones in the other column of sub-pixels of the at least two adjacent columns of sub-pixels.

17. The electroluminescent display panel of claim 11, wherein:

the transparent zone occupies 30%-70% of an area of the sub-pixel.

\* \* \* \* \*